United States Patent
Lee et al.

(10) Patent No.: US 7,081,325 B2
(45) Date of Patent: Jul. 25, 2006

(54) PHOTORESIST POLYMER AND PHOTORESIST COMPOSITION INCLUDING THE SAME

(75) Inventors: Sung Koo Lee, Seoul (KR); Jae Chang Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 246 days.

(21) Appl. No.: 10/719,355

(22) Filed: Nov. 21, 2003

(65) Prior Publication Data

US 2004/0265743 A1 Dec. 30, 2004

(30) Foreign Application Priority Data

Jun. 27, 2003 (KR) .................. 10-2003-0042525
Jun. 27, 2003 (KR) .................. 10-2003-0042524

(51) Int. Cl.
G03C 1/73 (2006.01)
G03F 7/038 (2006.01)
G03F 7/20 (2006.01)
G03F 7/30 (2006.01)
C08F 216/38 (2006.01)
C08F 220/56 (2006.01)

(52) U.S. Cl. .................. 430/270.1; 430/325; 430/331; 430/311; 430/905; 430/906; 430/910; 430/914; 430/921; 430/920; 430/925; 430/942; 430/945; 430/919; 430/966; 526/307.4; 526/307.5

(58) Field of Classification Search ........... 526/307.4, 526/307.5; 430/270.1, 914, 910, 925, 921, 430/325, 331, 311, 942, 945, 966, 919, 920, 430/905, 906

See application file for complete search history.

(56) References Cited

U.S. PATENT DOCUMENTS 4,151,333 A * 4/1979 Lenke et al. .................. 521/95
6,593,142 B1 * 7/2003 Kelly et al. .................. 436/1
2003/0236375 A1 * 12/2003 Salamone et al. ....... 526/307.5

* cited by examiner

*Primary Examiner*—Cynthia Kelly
*Assistant Examiner*—Sin J. Lee
(74) *Attorney, Agent, or Firm*—Marshall, Gerstein & Borun LLP

(57) ABSTRACT

Photoresist polymers and photoresist compositions containing the same are disclosed. A negative photoresist composition containing a photoresist polymer comprising a repeating unit represented by Formula 4 prevents collapse of patterns when photoresist patterns of less than 50 nm are formed. Accordingly, the disclosed negative photoresist composition is very effective for a photolithography process using EUV (Extreme Ultraviolet, 13 nm) light source.

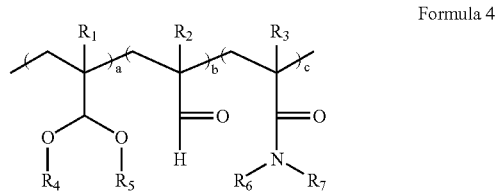

Formula 4 wherein $R_1$, $R_2$, $R_3$, $R_4$, $R_5$, $R_6$, $R_7$, a, b and c are as defined in the description.

20 Claims, 3 Drawing Sheets

PHOTORESIST POLYMER AND PHOTORESIST COMPOSITION INCLUDING THE SAME

TECHNICAL FIELD

Improved photoresist polymers and photoresist compositions containing the same are disclosed. More specifically, a photoresist polymers and photoresist compositions containing the same are disclosed which are useful for a photolithography processes using light sources of the far ultraviolet region such as EUV (Extreme Ultraviolet, 13 nm) during the manufacturing of ultrafine circuits of highly integrated semiconductor devices.

DESCRIPTION OF THE RELATED ART

Recently, in the manufacture of semiconductors, chemical amplification-type DUV (Deep Ultraviolet) photoresists have proven to be useful in achieving high sensitivity in processes for forming ultrafine patterns. These photoresists are prepared by blending a photoacid generator with polymer matrix having acid labile structures.

According to a reaction mechanism of such photoresists, the photoacid generator generates acids when it is irradiated by the light source. The main chain or branched chain of the polymer matrix in the exposed portion reacts with the generated acids, and is decomposed or cross-linked so that the polarity of the polymer is considerably altered. This alteration of polarity results in a solubility difference in the developing solution between the exposed area and the unexposed area. In case of negative photoresists, acids are generated in the exposed area, and the main chain or branched chain of the polymer compound causes a cross-linking reaction. As a result, the crosslinked polymer compounds are not dissolved in a subsequent development process, thereby forming negative images of a mask on the substrate.

In the photolithography process, resolution depends on wavelength of light sources. As the wavelength of light source becomes smaller, ultrafine patterns may be formed. For exposure equipment required to form patterns of less than 50 nm, EUV equipment is currently under development, and photoresists are also under development. When patterns of less than 50 nm are formed, the patterns of positive photoresists easily collapse. As a result, improved negative photoresists are needed which avoid the collapse problem associated with positive photoresists.

SUMMARY OF THE DISCLOSURE

Accordingly, photoresist polymers and photoresist compositions containing the same are disclosed which are useful for a photolithography process using an EUV light source when ultrafine patterns of less than 50 nm are formed.

Processes for forming a photoresist pattern by using the above-described photoresist composition are also disclosed. Semiconductor devices prepared according to the above-described process for pattern formation are also disclosed.

DETAILED DESCRIPTION OF THE PRESENTLY PREFERRED EMBODIMENTS

Figure 1:
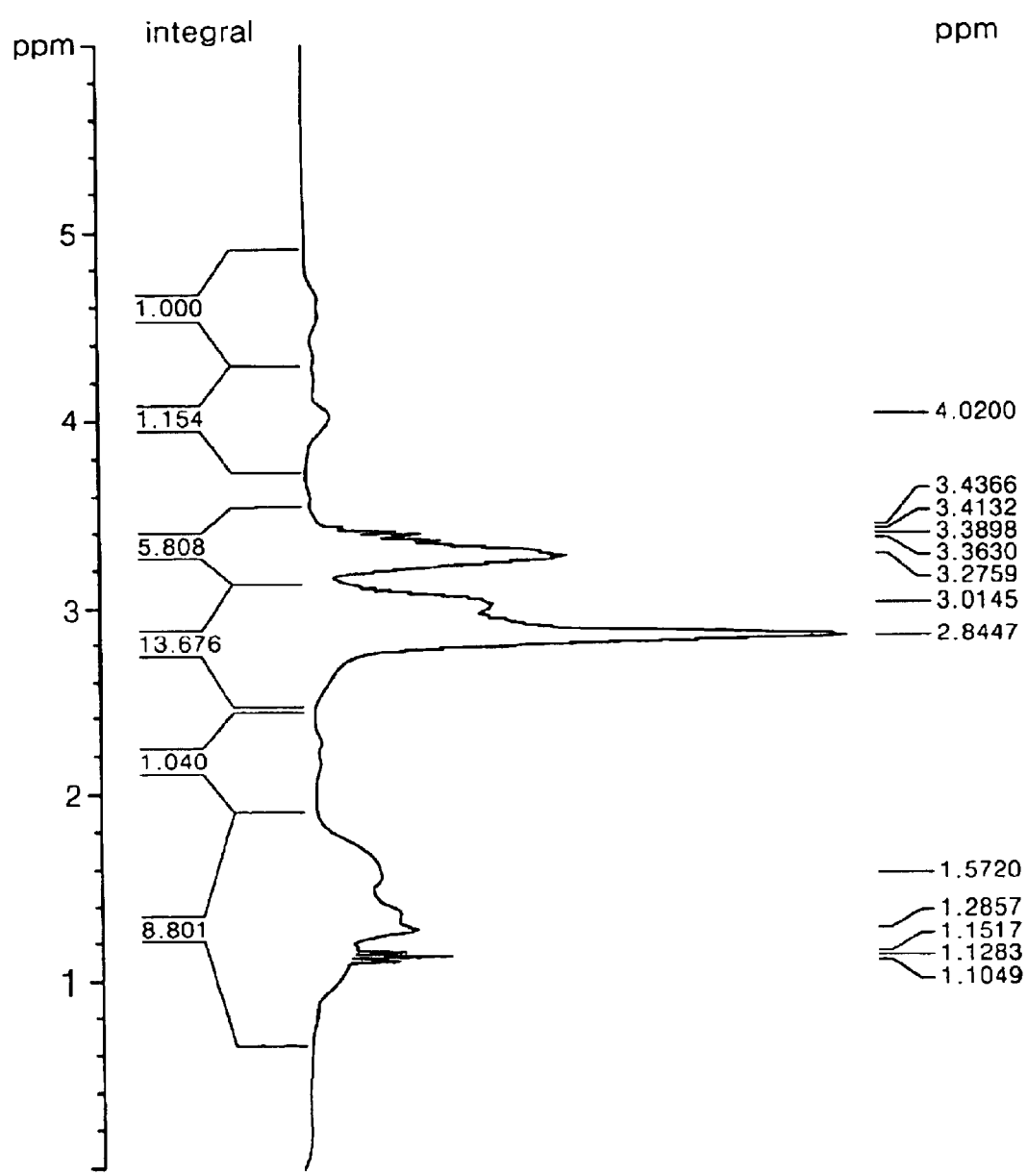
FIG. 1 is an NMR spectrum of a photoresist polymer obtained from Example 1.

A photoresist polymer comprises a repeating unit of Formula 1, Formula 2 and Formula 3:

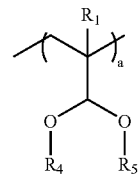

Formula 1

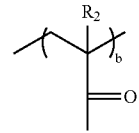

Formula 2

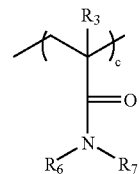

Formula 3 wherein $R_1$, $R_2$ and $R_3$ individually are hydrogen or methyl;

$R_4$, $R_5$, $R_6$ and $R_7$ individually are linear or branched $C_1$–$C_{10}$ alkyl;

a, b and c individually are numbers of repeating unit; and the relative ratio of a:b:c is in the range of 10~50 mol %:0~30 mol %:50~80 mol %.

The molecular weight of the photoresist polymer is 4000~40000. Preferably, the photoresist polymer comprises a repeating unit of Formula 4:

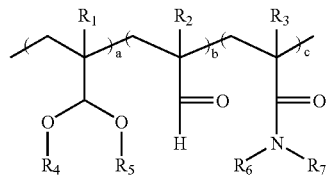

Formula 4 wherein $R_1$, $R_2$ and $R_3$ individually are hydrogen or methyl;

$R_4$, $R_5$, $R_6$ and $R_7$ individually are linear or branched $C_1$–$C_{10}$ alkyl; and the relative ratio of a:b:c is in the range of 10~50 mol %:0~30 mol %:50~80 mol %.

The photoresist polymer preferably comprises the repeating unit of Formula 4 in amount of at least 10 wt % based on the total photoresist polymer.

Preferably, the repeating unit of Formula 4 is poly(N,N-dimethylacrylamide/3,3-dimethoxypropene/acrolein).

In addition, there is provided a negative photoresist composition comprising a photoresist polymer described above as a base resin.

The disclosed negative photoresist composition further comprises polyvinylphenol or a second photoresist polymer comprising a repeating unit of Formula 5, Formula 6 and Formula 7 as the base resin:

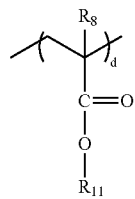

Formula 5

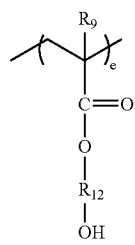

Formula 6

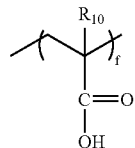

Formula 7 wherein $R_8$, $R_9$ and $R_{10}$ individually are hydrogen or methyl;

$R_{11}$ is linear or branched $C_1$–$C_{10}$ alkyl; and $R_{12}$ is linear or branched $C_1$–$C_{10}$ alkylene.

The molecular weight of the second photoresist polymer is 4000□40000. Preferably, the second photoresist polymer comprises a repeating unit of Formula 8:

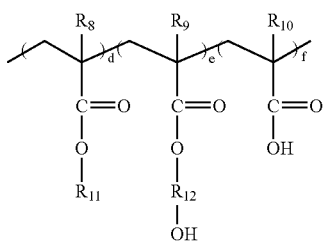

Formula 8 wherein $R_8$, $R_9$ and $R_{10}$ individually are hydrogen or methyl;

$R_{11}$ is linear or branched $C_1$–$C_{10}$ alkyl;

$R_{12}$ is linear or branched $C_1$–$C_{10}$ alkylene;

d, e and f individually are numbers of repeating unit; and the relative ratio of d:e:f is in the range of 10~70 mol %:10~50 mol %:10~50 mol %.

The second photoresist polymer preferably comprises the repeating unit of Formula 8 in amount of at least 10 wt % based on the total second photoresist polymer.

Preferably, the repeating unit of Formula 8 is selected from the group consisting of poly(methylmethacrylate/2-hydroxyethylmethacrylate/acrylic acid), poly(methylmethacrylate/2-hydroxypropylmethacrylate/acrylic acid), poly(ethylmetha-crylate/2-hydroxypropylmethacrylate/acrylic acid) and poly(ethylmethacrylate/2-hydroxyethylmethacrylate/acrylic acid).

The disclosed negative photoresist composition comprises blend polymer of poly(N,N-dimethylacrylamide/3,3-dimethoxypropene/acrolein) and polyvinylphenol, blend polymer of poly(N,N-dimethylacrylamide/3,3-dimethoxypropene/acrolance) and poly(methylmethacrylate/2-hydroxyethylmethacrylate/acrylic acid), blend polymer of poly(N,N-dimethylacrylamide/3,3-dimethoxyypropene/acrolein) and poly(methylmethacrylate/2-hydroxypropylmethacrylate/acrylic acid), blend polymer of poly(N,N-dimethylacrylamide/3,3-dimethoxypropene/acrolein) and poly(ethylmethacrylate/2-hydroxyprophylmethacrylate/acryl acid), blend polymer of poly(N,N-dimethylacrylamide/3,3-dimethoxypropene/acrolein) and poly(ethylmethacrylate/2-hydroxyethylmethacrylate/acrylic acid) or mixtures thereof as a base resin.

The disclosed photoresist composition comprising the above photoresist polymers as a base resin also includes an organic solvent and a photoacid generator.

Any of conventional photoacid generators, which may generate acids when they are exposed to light, can be used. Some of conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Sulfide type or onium type compounds are primarily used for the photoacid generator.

Preferably, the photoacid generator is one or more selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-tert-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone and naphthylimido trifluoromethane sulfonate. The photoacid generator is preferably present in an amount ranging from 1 to 10 wt % to the base resin. When the photoacid generator is present in the amount of less than 1 wt %, it lowers photosensitivity of the photoresist composition. When the photoacid generator is present in the amount of more than 10 wt %, it results in a poor pattern formation due to its high absorption of far ultraviolet rays.

Any of organic solvents, which are generally used in the photoresist composition, can be used. Some of conventional solvents are also disclosed in the documents described above. Preferred organic solvents for the photoresist composition include methyl 3-methoxypropionate, ethyl 3-ethoxypropionate, propyleneglycol methyletheracetate, cyclohexanone, 2-heptanone and ethyllactate. Preferably, the organic solvent is present in an amount ranging from 700 to 4000 wt % to the base resin in order to obtain a photoresist film having a desired thickness.

Processes for forming a photoresist pattern may comprise:

(a) coating the photoresist composition described above on an underlying layer to form a photoresist film;

(b) exposing the photoresist film to light; and (c) developing the resulting structure to obtain a photoresist pattern.

The process for forming a photoresist pattern can further comprise soft baking before part (b) or post baking after part (b). Preferably, the soft and post baking steps are performed at a temperature ranging from 70 to 200° C.

Exemplary light sources include EUV (13 nm), ArF (193 nm), KrF (248 nm), VUV (157 nm), E-beam, X-ray and ion beam. Preferably, the exposure energy ranges from 1 to 100 mJ/cm$^2$.

Part (c) can be performed with an alkaline developing solution which is preferably TMAH (tetramethylammonium hydroxide) aqueous solution ranging from 0.01 to 5 wt %.

According to mechanism of the disclosed negative photoresist, the photoacid generator generates acids when they are exposed to ultraviolet rays from light sources. In the baking process after exposure, the acids cause cross-linking reaction of the polymer comprising repeating unit of Formula 4 with polyvinylphenol or the polymer comprising repeating unit of Formula 4 with the polymer comprising repeating unit of Formula 8 so that they are not dissolved in the subsequent development process. However, since the cross-linking reaction does not occur in the unexposed area, the polymers are dissolved in the subsequent development process, thereby forming negative images of a mask on the substrate.

A semiconductor device manufactured according to the process described above is also disclosed.

The disclosed photoresist polymers and photoresist compositions containing the same will be described in more details by referring to examples below, which are not intended to be limiting.

EXAMPLE 1

Preparation of Photoresist Polymer (1)

To tetrahydrofuran (300 g) were added N,N-dimethylacrylamide (70 g), acrolein (30 g) and AIBN (2,2'-azobisisobutyronitrile) (5 g). The resulting mixture was reacted at 66° C. for 8 hours. After reaction, the resulting mixture was precipitated in ether, filtered, and dehydrated, thereby obtaining poly(N,N-dimethylacrylamide/acrolein) (45 g).

To methanol (1L) were added poly(N,N-dimethylacrylamide/acrolein) (45 g) and p-toluenesulfonic acid (0.5 g). The resulting mixture was refluxed at 90° C. for 24 hours, and concentrated using a rotary distiller.

Then, the concentrated resulting solution was added to normal hexane (2L), and stirred to separate product from ethylether. The ethylether was removed, and mucous product remained on the bottom of a beaker. The product was dehydrated to obtain poly(N,N-dimethylacrylamide/3,3-dimethoxypropene/acrolein) (see FIG. 1).

EXAMPLE 2

Preparation of Photoresist Polymer (2)

To tetrahydrofuran (250 g) and methylethylketone (250 g) were added methylmethacrylate (40 g), 2-hydroxyethylmethacrylate (30 g), acrylic acid (30 g) and AIBN (2.5 g). The resulting mixture was reacted at 66° C. for 8 hours. After reaction, the resulting mixture was precipitated in ether, filtered, and dehydrated, thereby obtaining poly(methylmethacrylate/2-hydroxyethylmethacrylate/acrylic acid) (86 g). The polystyrene converted number average molecular weight of poly(methylmethacrylate/2-hydroxyethyl methacrylate/acrylic acid) was 17,500.

EXAMPLE 3

Preparation of Photoresist Composition (1)

To propyleneglycolmethyletheracetate (PGMEA) (130 g) as an organic solvent were added poly(N,N-dimethylacryladmie/3,3-dimethoxypropene/acrolein) (3 g) obtained from Example 1, polyvinylphenol having molecular weight of 8,000 (7 g) and triphenylsulfonium triflate (0.05 g) as a photoacid generator. The resulting mixture was filtered with a 0.20 μm filter, thereby a disclosed photoresist composition.

EXAMPLE 4

Preparation of Photoresist Composition (2)

To propyleneglycolmethyletheracetate (PGMEA) (130 g) as an organic solvent were added poly(N,N-dimethylacryladmide/3,3-dimethoxypropene/acrolein) (3 g) obtained from Example 1, poly(methylmethacrylate/2-hydroxyethylmethacrylate/acrylic acid) (7 g) obtained from Example 2 and triphenylsulfonium triflate (0.05 g) as a photoacid generator. The resulting mixture was filtered with a 0.20 μm filter, thereby a disclosed photoresist composition.

EXAMPLE 5

Formation of Photoresist Patterns (1)

Figure 2:
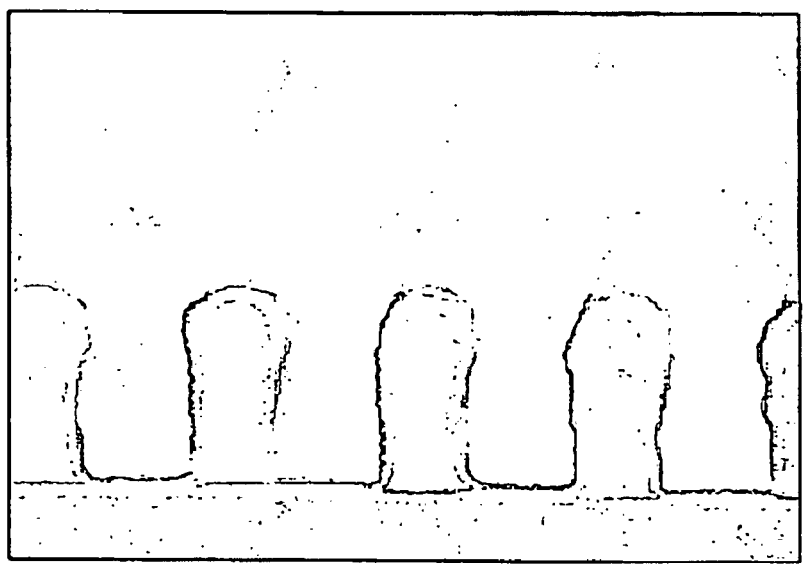
FIG. 2 is a photograph of a photoresist pattern formed using a photoresist composition obtained from Example 3.

The photoresist composition obtained from Example 3 was spin-coated on a silicon wafer to form a photoresist film, and baked at 130° C. for 90 seconds. After baking, the photoresist film was exposed to light using an ArF exposer of ASML Co. Ltd., and then post-baked at 130° C. for 90 seconds. When the post-baking was completed, it was developed in 2.38 wt % aqueous TMAH solution for 40 seconds, to obtain 100 nm L/S pattern without collapse (see FIG. 2).

EXAMPLE 6

Formation of Photoresist Patterns (2)

Figure 3:
FIG. 3 is a photograph of a photoresist pattern formed using a photoresist composition obtained from Example 4.

The photoresist composition obtained from Example 4 was spin-coated on a silicon wafer to form a photoresist film, and baked at 130° C. for 90 seconds. After baking, the photoresist film was exposed to light using an ArF exposer of ASML Co. Ltd., and then post-baked at 130° C. for 90 seconds. When the post-baking was completed, it was developed in 2.38 wt % aqueous TMAH solution for 40 seconds, to obtain 100 nm L/S pattern without collapse (see FIG. 3).

As discussed earlier, ultrafine patterns without collapse are formed by using the disclosed negative photoresist composition containing a photoresist polymer which causes cross-linking reaction by acids generated from exposure. The disclose photoresist composition is very useful for a photolithography process using EUV for forming patterns of less than 50 nm.

What is claimed is:

1. A photoresist polymer comprising a repeating unit of Formula 1, Formula 2 and Formula 3:

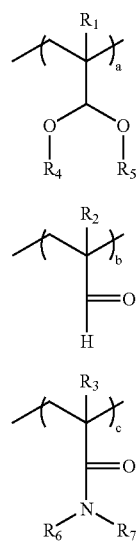

Formula 1

Formula 2

Formula 3 wherein $R_1$, $R_2$ and $R_3$ individually are hydrogen or methyl;

$R_4$, $R_5$, $R_6$ and $R_7$ individually are linear or branched $C_1$–$C_{10}$ alkyl;

a, b and c individually are numbers of repeating unit; and the relative ratio of a:b:c is in the range of 10~50 mol %:0~30 mol %:50~80 mol %.

2. The photoresist polymer according to claim 1, wherein the molecular weight of the photoresist polymer is 4000–40000.

3. The photoresist polymer according to claim 1, wherein the polymer comprises a repeating unit of Formula 4:

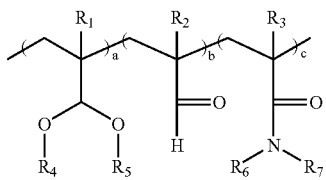

Formula 4 wherein $R_1$, $R_2$ and $R_3$ individually are hydrogen or methyl;

$R_4$, $R_5$, $R_6$ and $R_7$ individually are linear or branched $C_1$–$C_{10}$ alkyl; and the relative ratio of a:b:c is in the range of 10~50 mol %:0~30 mol %:50~80 mol %.

4. The photoresist polymer according to claim 3, wherein the repeating unit of Formula 4 is present in amount of at least 10 wt % based on the total photoresist polymer.

5. The photoresist polymer according to claim 3, wherein the repeating unit of Formula 4 is poly(N,N-dimethylacrylamide/3,3-dimethoxypropene/acrolein).

6. A photoresist composition comprising a photoresist polymer of claim 1 as a base resin, a photoacid generator and an organic solvent.

7. The photoresist composition according to claim 6, further comprising polyvinylphenol as a base resin.

8. The photoresist composition according to claim 6, further comprising a second photoresist polymer including a repeating unit of Formula 5, Formula 6 and Formula 7 as a base resin:

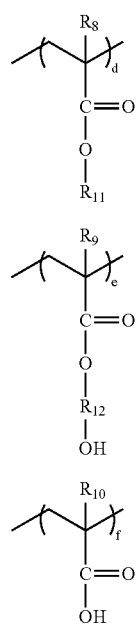

Formula 5

Formula 6

Formula 7 wherein $R_8$, $R_9$ and $R_{10}$ individually are hydrogen or methyl;

$R_{11}$ is linear or branched $C_1$–$C_{10}$ alkyl;

$R_{12}$ is linear or branched $C_1$–$C_{10}$ alkylene;

d, e and f individually are numbers of repeating unit; and the relative ratio of d:e:f is in the range of 10~70 mol %:10~50 mol %:10~50 mol %.

9. The photoresist composition according to claim 8, wherein the molecular weight of the second photoresist polymer is 4000–40000.

10. The photoresist composition according to claim 8, wherein the second photoresist polymer comprises a repeating unit of Formula 8:

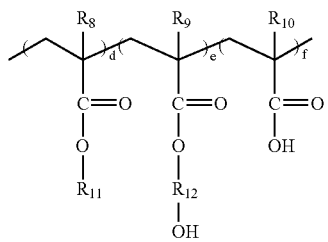

Formula 8 wherein $R_8$, $R_9$ and $R_{10}$ individually are hydrogen or methyl;

$R_{11}$ is linear or branched $C_1$–$C_{10}$ alkyl;

$R_{12}$ is linear or branched $C_1$–$C_{10}$ alkylene; and the relative ratio of d:e:f is in the range of 10~70 mol %:10~50 mol %:10~50 mol %.

11. The photoresist composition according to claim 10, wherein the repeating unit of Formula 8 is present in amount of at least 10 wt % based on the total second photoresist polymer.

12. The photoresist composition according to claim 10, wherein the repeating unit of Formula 8 is selected from the group consisting of poly(methylmethacrylate/2-hydroxyethylmethacrylate/acrylic acid), poly (methylmethacrylate/2-hydroxypropylmethacrylate/acrylic acid), poly(ethylmethacrylate/2-hydroxypropylmethacrylate/acrylic acid) and poly(ethylmethacrylate/2-hydroxyethylmethacrylate/acrylic acid).

13. The photoresist composition according to claim 6, wherein the photoresist composition comprises a photoresist polymer selected from the group consisting of blend polymer of poly(N,N-dimethylacrylamide/3,3-dimethoxypropene/acrolein) and polyvinylphenol, blend polymer of poly(N,N-dimethylacrylamide/3,3-dimethoxypropene/acrolance) and poly(methylmethacrylate/2-hydroxyethylmethacrylate/acrylic acid), blend polymer of poly(N,N-dimethylacrylamide/3,3-dimethoxyypropene/acrolein) and poly(methylmethacrylate/2-hydroxypropylmethacrylate/acrylic acid), blend polymer of poly(N,N-dimethylacrylamide/3,3-dimethoxypropene/acrolein) and poly(ethylmethacrylate/2-hydroxyprophylmethacrylate/acryl acid), blend polymer of poly(N,N-dimethylacrylamide/3,3-dimethoxypropene/acrolein) and poly(ethylmethacrylate/2-hydroxyethylmethacrylate/acrylic acid) and mixtures thereof as a base resin.

14. The photoresist composition according to claim 6, wherein the photoacid generator is one or more selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-tert-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone and naphthylimido trifluoromethane sulfonate.

15. The photoresist composition according to claim 6, wherein the photoacid generator is present in an amount ranging from 1 to 10 wt % to the base resin.

16. The photoresist composition according to claim 6, wherein the organic solvent is selected from the group consisting of methyl 3-methoxypropionate, ethyl 3-ethoxypropionate, propyleneglycol methyletheracetate, cyclohexanone, 2-heptanone, ethyllactate and mixtures thereof.

17. The photoresist composition according to claim 6, wherein the organic solvent is present in an amount ranging from 700 to 4000 wt % to the base resin.

18. A process for forming a photoresist pattern comprising:
   (a) coating the photoresist composition of claim 6 on an underlying layer to form a photoresist film;
   (b) exposing the photoresist film to light; and
   (c) developing the resulting structure to obtain a photoresist pattern.

19. The process according to claim 18, further comprising soft baking before part (b) or post baking after part (b).

20. The process according to claim 18, wherein the source of the light is selected from the group consisting of EUV, KrF, ArF, VUV, E-beam, X-ray and ion beam.

* * * * *